United States Patent [19]

Cummings et al.

[11] Patent Number: 4,714,504

[45] Date of Patent: Dec. 22, 1987

[54] PROCESS OF LAMINATING A PHOTOSENSITIVE LAYER OF A SUBSTRATE

[75] Inventors: Michael J. Cummings, Vestal; Donald E. Hanford, Barton; Robert M. Japp, Vestal, all of N.Y.

[73] Assignee: IBM Corporation, Armonk, N.Y.

[21] Appl. No.: 917,716

[22] Filed: Oct. 10, 1986

[51] Int. Cl.⁴ ................. B30B 15/34; B30B 31/04; B30B 31/10
[52] U.S. Cl. .................................. 156/64; 156/269; 156/351; 156/358; 156/359; 156/361; 156/363; 156/366; 156/522; 156/555; 156/556; 100/93 RP
[58] Field of Search ............... 156/64, 269, 351, 358, 156/359, 361, 363, 366, 511, 522, 555, 308.8, 556; 100/93 RP

[56] References Cited

U.S. PATENT DOCUMENTS

| | | | |
|---|---|---|---|
| 3,623,933 | 11/1971 | Staats | 156/552 |
| 3,658,629 | 4/1972 | Cramer et al. | 156/552 |
| 4,025,380 | 5/1977 | Bernardo | 156/355 |
| 4,214,936 | 7/1980 | Del Bianco | 156/302 |
| 4,248,655 | 2/1981 | Kerwin | 156/351 |
| 4,293,635 | 10/1981 | Flint et al. | 430/271 |
| 4,338,152 | 7/1982 | DelBianco et al. | 156/351 |
| 4,378,264 | 3/1983 | Pilette et al. | 156/238 |
| 4,405,394 | 9/1983 | Cohen | 156/83 |
| 4,495,014 | 1/1985 | Gebrian et al. | 156/80 |
| 4,579,612 | 4/1986 | Held | 156/64 |
| 4,585,509 | 4/1986 | Obayashi | 156/497 |

Primary Examiner—Robert A. Dawson
Assistant Examiner—Lori Cuervo
Attorney, Agent, or Firm—Perman & Green

[57] ABSTRACT

A process for laminating discrete sections of a supported photosensitive layer onto a continuing series of sheet substrates. Each substrate is advanced to and through the nip of heated application rolls, and a continuous length of the supported photosensitive layer is also supplied to the nip. When the substrate reaches a first location positioned between the application rolls, all movement ceases except that the rolls move from an inactive disengaged position toward the substrate to an active position to cause pressure contact between the photosensitive layer and the substrate to thereby laminate the photosensitive layer to the substrate. There is a pause for a predetermined period of time with the rolls in the active positions before the substrate is again advanced with the rolls still in the active positions and the photosensitive layer again supplied to the nip. When the substrate reaches a second location, all motion ceases once again and there is another pause for another predetermined period of time with the rolls in the active positions after which the rolls are withdrawn to an inactive position. During the second pause, a successive substrate continues to advance toward the preceding stationary substrate. At appropriate times, the supported photosensitive layer is trimmed from the laminated photosensitive layer. The resulting laminated substrate is provided with well defined edges of the photosensitive layer where it is firmly laminated to the substrate along lines spaced from the leading and trailing edges of the substrate. This desirably results in an unlaminated margin adjacent the leading and trailing edges of the substrate.

14 Claims, 9 Drawing Figures

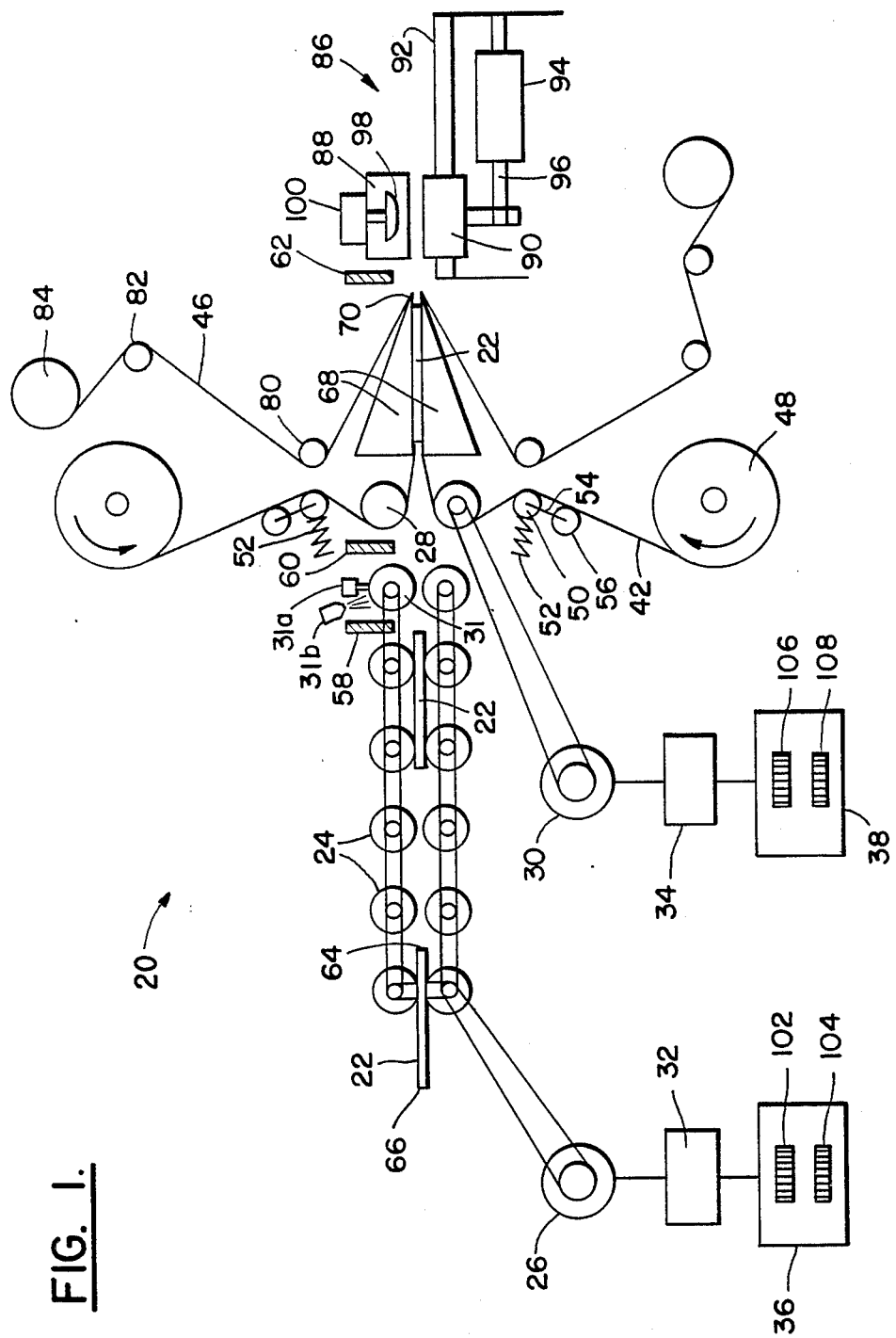
FIG. I.

PROCESS OF LAMINATING A PHOTOSENSITIVE LAYER OF A SUBSTRATE

BACKGROUND OF THE INVENTION

I. Field of the Invention

This invention relates to an improved process for laminating a discrete section of a photosensitive layer to at least one substrate and automatically trimming the laminated sections.

II. Description of the Prior Art

Typical of the prior art of laminating processes in which a relatively thin layer of material is applied to a relatively thick substrate are the U.S. patents to Del Bianco, U.S. Pat. No. 4,214,936, and to Gebrian et al, U.S. Pat. No. 4,495,014.

According to Del Bianco, a continuing series of panels to be laminated are advanced through succesive preparatory stations before laminating occurs. Each panel is preheated by rolls which advance the panels toward the nip of rolls which actually perform the lamination step. A sensor immediately upstream of the nip of the laminating rolls senses the leading and trailing edges of a panel to cause time delayed operation of the laminating rolls. This results in a discontinous operation with the stated desired result of uniformly spacing the resultant laminated panels from each other. As disclosed in Del Bianco, the laminating rolls remain closed at all times and rotate continuously while a panel is inserted between them. As a result, the entire length of a panel is laminated. Also, the rolls operate discontinuously. Once they start to rotate, they continue until the panel advances through and beyond them. Successive panels are loosely joined by an interconnecting length of film and no mechanism is disclosed for severing the film from the panel.

In Gebrian et al, a board to be laminated is heated, then advanced into the open nip of a pair of pressure rolls. A web of photosensitive film which includes a photosensitive layer coated on a carrier web is advanced from a feed roll to the open nip and over each pressure roll so that the photosensitive layer faces inward toward the advancing board. The pressure rolls are brought together at a specific distance behind the leading edge of the board to form a line of pressure perpendicular to the direction of advance. The board continues to advance through the closed nip and the photosensitive layer is laminated to the board surface until a second specified distance along the board is reached, at which time, with the board still advancing, the pressure rolls are separated and returned to the open nip configuration. The photosensitive layer is trimmed from the carrier web at the locations at which the lamination respectively begins and ends on the board. Each pressure roll for applying the photosensitive film is then reversed so that the terminal edge of the photosensitive film on the carrier web is returned to the nip of the pressure rolls for lamination on a subsquent board on a further surface of the same board to thereby avoid waste.

Prior Art having the general nature of the patents just described exhibit some drawbacks. For example, it often occurred that substrates operated on by prior art processes, when laminated, would exhibit a photosensitive layer having localized poor adhesion on the substrate resulting in ragged edges of the photosensitive layer along the line of demarcation at which the photosensitive layer is laminated to the substrate. In turn, small chips or flakes of the photosensitive layer then tend to break off and adhere to the surface of the laminated substrate at other locations. Such adherence at other locations will cause undesirable exposure variations during a later step which adversely affect the end product. Another drawback of prior art processes resided in the fact that they required greater spacing between successive substrates resulting in a lower production rate than desirable. This often resulted in wastage of photosensitive layer material. Since the photosensitive layer material generally continues to advance to the nip of the pressure rolls even when it extends between successive substrates, it follows that the greater the distance between successive substrates, the greater the wastage of the photosensitive layer material. Additionally, systems for performing prior art processes often lacked the ability to readily readjust so as to accomodate, as desired, different sizes of substrates and different sizes of placements of the photosensitive layer.

It was with knowledge of the current state of the art and in view of the problems previously encountered as noted above, that the present invention was conceived and has now been reduced to practice.

SUMMARY OF THE INVENTION

The present invention pertains to a process for laminating discrete sections of a supported photosensitive layer onto a continuing series of sheet substrates. Each substrate is advanced to and through the nip of heated application rolls at the same time that a continuous length of the supported photosensitive layer is also supplied to the nip. When the substrate reaches a first location positioned between the application rolls, all movement ceases except that the rolls move from an inactive disengaged position toward the substrate to an active position to cause pressure contact between the photosensitive layer and the substrate to thereby laminate the photosensitive layer to the substrate. There is a pause for a predetermined period of time with the rolls in the active positions before the substrate is again advanced with the rolls still in the active positions and the photosensitive layer again supplied to the nip.

When the substrate reaches a second location, all motion ceases once again and there is another pause for another predetermined period of time with the rolls in the active positions after which the rolls are withdrawn to an inactive position. During the second pause, a successive substrate continues to advance toward the preceding stationary substrate. At appropriate times, the supported photosensitive layer is trimmed from the laminated photosensitive layer. The resulting laminated substrate is provided with well defined edges of the photosensitive layer where it is firmly laminated to the substrate along lines spaced from the leading and trailing edges of the substrate. This desirably results in an unlaminated margin adjacent the leading and trailing edges of the substrate.

There are a number of benefits which flow directly from the invention as disclosed. In a first instance, a unique feature of the invention resides in the operation of the lamination process in the course of which the application rolls are caused to pause in an active position where they cause pressure contact between the sensitive layer and the substrate for laminating the former to the latter near the leading edge and near the trailing edge of the substrate. The pause which occurs for a predetermined period of time allows pressure and temperature to become substantially more uniform across the photosensitive layer and substrate and thereby establishes a distinct "foot print". This has the result that a straighter, less ragged line of demarcation of the photosensitive layer is achieved where it adheres to the substrate.

Another feature of the invention is that it improves the accuracy of placement of the lines of demarcation on the substrate. A concomitant benefit is the repeatability of placement of the photosensitive layer on the substrate. This is achieved because the substrate is stopped at a known location when the rolls are closed and when they are opened.

Yet another feature of the invention is that it assures a high rate of productivity of laminated substrates by continuing to advance successive substrates during the pause at a substrate presently being laminated, and at the same time reducing waste of the photosensitive layer.

Yet another feature is the unique method used to regulate the amount of water present on the substrate surface during lamination. Previous equipment used gravity loaded linen covered rollers to both apply and remove the excess water necessary for adhesion of the photosensitive layer. The new invention uses a set of rubber coated squeegee rolls. The correct amount of retained water is obtained by adjusting the pressure on two air cylinders which force the squeegee rollers together. The new method is superior to the previous method because of its adjustability and because the rubber coating now used never requires replacement as did the old.

Other and further features, objects, advantages, and benefits of the invention will become apparent from the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention and, together with the description, serve to explain the principles of the invention in general terms. Like numerals refer to like parts throughout the disclosure.

BRIEF DESCRIPTION OF THE DRAWINGS

FIG. 1 is a diagrammatic representation of the process of the present invention involving laminating and trimming of a photosensitive layer applied to a continuing series of substrates;

DETAILED DESCRIPTION OF THE PREFERRED EMBODIMENT

Figure 2D:
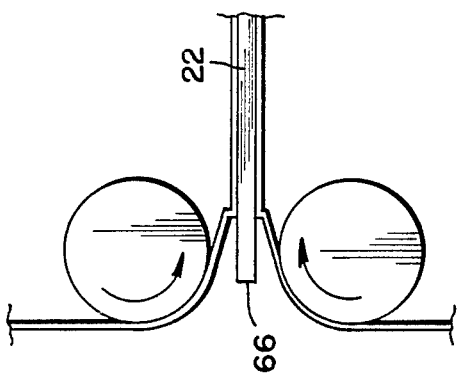
FIGS. 2A, 2B, 2C, and 2D are detailed side elevation views which illustrate successive steps in the laminating process of FIG. 1 and, specifically, relative positions of the application rolls, substrates, and the photosensitive layer according to the FIG. 1 process.

The present invention has been conceived and reduced to practice in order to satisfy recent requirements of the end product design. In this regard, an improved capability was sought for placing a photosensitive layer, sometimes referred to as "photo resist", on a copper-epoxy/glass substrate in a manner assuring a margin around the periphery of the substrate which is free of the photo resist. Furthermore, it was determined necessary to precisely control the magnitude of the margin while minimizing resist waste, obtain a flake free resist edge, and easily adjust the relative placement of the resist on the substrate and/or the magnitude of the margin. To this end, known processes have been modified and, as disclosed herein, have resulted in a markedly improved end product.

Turn now to the drawings, and initially to FIG. 1, which illustrates a computer controlled lamination system 20 which operates on a plurality of substrates 22 as they are advanced from left to right by suitable conveyor rolls 24 which are continuously rotating. The rolls 24 may have an outer covering of polyurethane rubber or other suitable resilient material to have improved frictional characteristics as well as to prevent harm to the substrates 22.

The conveyor rolls 24 are operated by means of a drive motor 26. A pair of opposed application rolls 28 positioned to the right of the conveyor rolls 24 are aligned with the opposed conveyor rolls and are operated by a suitable drive motor 30. It is important that the motors 26 and 30 be synchronized so that the rotational speeds of the rolls 24 and 28 are equal, a typical surface speed being in the range of approximately four to six feet per minute. The application rolls 28 are preferably formed of steel with an outer coating of silicon rubber or other suitable resilient material.

Intermediate the application rolls 28 and the conveyor rolls 24 are a pair of similarly opposed squeegee rollers 31 between which the substrates 22 pass. The squeegee rollers are covered, in a fashion generally similar to the application rolls, with rubber or a rubber-like material. One or more pressure cylinders 31A serve to urge the squeegee rollers into engagement with the substrates at the same time that water is applied to their outer surfaces as schematically represented by a nozzle 31B. Since either too much water or too little water will detract from the ability of the photo resist to adhere to the substrate, the pressure cylinders 31A are operated to assure that just the correct amount of water is retained on the rollers when they engage the substrate.

Associated with each of the drive motors 26 and 30 is, respectfully, a suitable encoder/pulse generator 32 and 34, and, in turn, a counter/preset device, 36 and 38. One example of an encoder/pulse generator suitable for purposes of the invention is Type RE1-600 sold by Shimpo of Cedarhurst, N.Y. An example of a counter/present device suitable for purposes of the invention is Model CB-126 manufactured by Dynapar of Gurnee, IL.

Figure 2C:
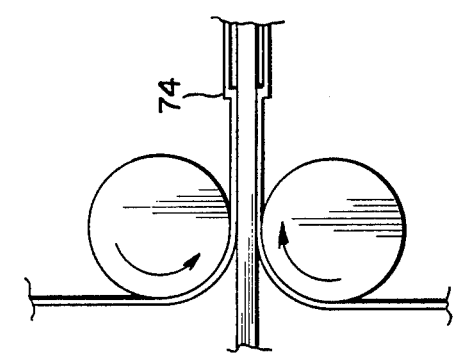

In the course of operation of the system 20, a substrate 22 is advanced by the conveyor rolls 24 toward and through the preloaded squeegee rollers 31, then toward and through a nip 40 (see FIG. 2A) between converging surfaces of the opposed heated application rolls 28. The nip 40 can be defined as that region between the opposed application rolls 28 and lying in a plane which includes the rotational axes of the rolls.

A web of photosensitive material 42 which includes a photosensitive layer 44 coated on a polyester carrier web 46 which may be, for example, manufactured by E. I. duPont de Nemours and Company under the trademark "MYLAR" is advanced from a feed roll 48 to the nip 40 upon rotation of the application rolls 28. Specifically, the web material 42 is drawn across the heated application rolls 28 such that rotation of the application rolls serves to draw the web material from each associated feed roll. Each feed roll 48 is preferably provided with a drag clutch (not shown) to impart tension to the web material 42. An additional expedient to maintain tension of the web material 42 at a relatively constant level is a tension roll 50 (see FIG. 1). The tension roll 50 is rotatably engagable with the web material 42, being biased thereagainst by a spring 52. The tension roll 50 may be rotatably mounted on a rocker arm 54 which, in turn, is pivotally mounted about an axis 56 generally parallel to the axis of rotation of the tension roll 50.

Movement of each substrate 22 as it moves through the system 20 is detected by a series of suitable sensors 58, 60, and 62 provided at spaced locations along the path of a substrate. In the course of the operation of the system 20, whenever the drive motor 26 is operated to rotate the conveyor rolls 24 or the drive motor 30 is operated to drive the applicator rolls 28, the encoder pulse generators 32, 34 associated with the respective motors generate electrical pulses and transmit these pulses to associated counter/preset devices 36, 38. The counter/preset devices 36, 38 are notified by the sensors when to start counting the pulses received from the encoder pulse generators. Whenever the number of the pulses received and counted reaches a preset number, the appropriate counter/preset device signals the system controller that it is time for some event to occur. The further operation of the sensors 58, 60, and 62, particularly in conjunction with the counter/preset devices 36, 38 will be described subsequently.

As the leading edge of a first of a continuing series of substrates 22 passes the sensor 58, the application rolls 28 remain withdrawn in the inactive position (FIG. 2A), but the drive motor 30 is activated so as to advance the web of photosensitive material 42 beyond the nip 40. This is for the reason that the photosensitive layer 44 has been positioned against the application rolls 28 for a sufficient period of time with the rolls stationary that the heat of the application rolls adversely affects the chemical makeup of the photosensitive layer 44. The rotation of the application rolls 28, when they are thus, withdrawn to the inactive disengaged position, thereby assures that the affected photosensitive layer 44 will not be applied to a subsequent substrate 22.

Figure 2B:
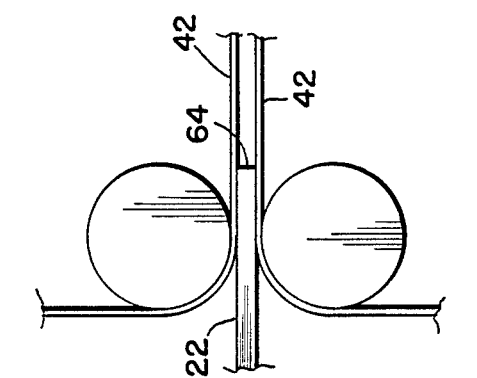
Figure 2A:
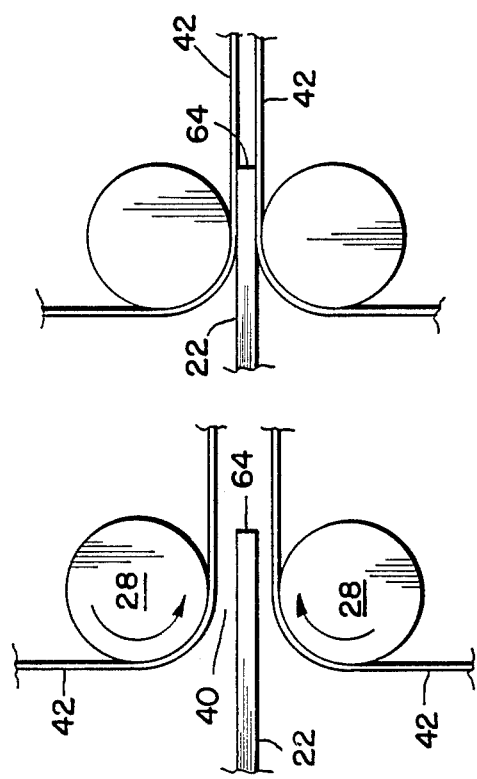

When a substrate 22 is properly positioned so that a leading edge 64 (FIG. 3) extends a short distance beyond the nip 40, the drive motors 26 and 30 will have paused in their operation and the heated application rolls 28 moved, in a suitable manner and by suitable structure (not shown), transversely from an inactive disengaged position (FIG. 2A) toward the substrate 22 to an active position (FIG. 2B). This occurs to cause pressure contact between the photosensitive layers 42 and the substrate whereby the photosensitive layer is laminated to the substrate. With the application rolls 28 thereby in the active position, the drive motors 26 and 30 continue to pause (FIG. 2B) for a first predetermined period of time.

The time of the pause as well as the temperature of the application rolls 28 depends upon whether the substrates 22 are "thick" or "thin". For example, in the instance of a "thick" substrate, that is, a copper coated epoxy substrate having a total thickness within the range of 0.035 and 0.045 inches, a temperature of approximately 260° F. would be appropriate for a duration of 0.75 seconds. In the instance of a "thin" substrate, that is, one whose thickness lies in the range of 0.007 to 0.013 inches of copper coating on epoxy, a temperature of 220° F. is appropriate for a duration of 0.33 seconds. It is noteworthy that a typical "foot print" would be about 0.25 inches in length and is effective to cause the photosensitive layer 44 to be evenly bonded to the surface of the substrate 22.

Figure 4:
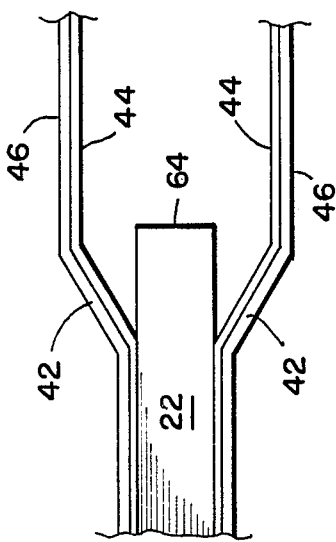
FIG. 4 is diagrammatic side elevation view of one end of a substrate to which a photosensitive layer has been applied, correlating generally to the step illustrated in FIG. 2C.

After the first predetermined period of time with the application rolls 28 in the active position has passed, the motors 26 and 30 are activated, once again, to advance the substrate 22 along its path through the system 20 (FIGS. 2C and 4). When the substrate reaches a second location, still positioned between the application rolls 28 but such that a trailing edge 66 of the substrate is positioned a small distance to the left (FIG. 1) of the nip 40, only the drive motor 30 is interrupted in its operation while the application rolls 28 remain in the active position. This happens for a second predetermined period of time which may be of the same duration as the first predetermined period of time.

Thereafter, the application rolls are withdrawn to the inactive position (FIG. 2D) and the drive motor 30 is again activated so as to advance the web material 42 and substrate 22 beyond the nip 40. While the application rolls 28 are stopped on the trailing edge of the substrate, as discussed above, the conveyor rolls 24 continue in operation and convey the next substrate 22 through the squeegee rollers 31 and under the sensor 60, starting operation of the counter/preset device 36. At this point, the application cycle begins for the next substrate.

Figure 3:
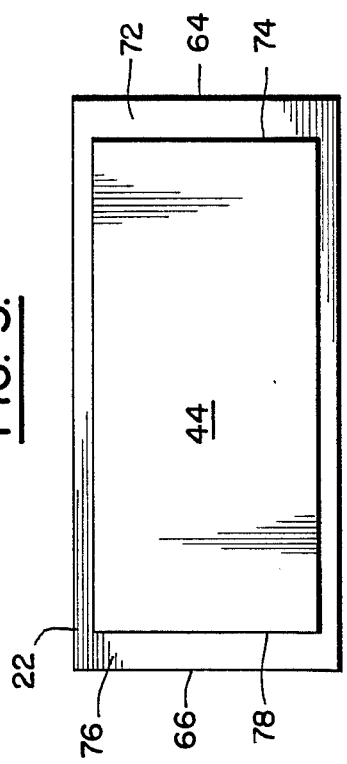
FIG. 3 is top plan view of a substrate with a photosensitive layer applied thereto according to the invention.

The pause of the application rolls in the active position which thereby causes pressure contact between the photosensitive layer 44 and the substrate 22 thereby defines, viewing FIG. 3, a margin 72 between the leading edge 64 of the substrate and a beginning line of demarcation 74 of the photosensitive layer where it is laminated to the substrate. Similarly, a margin 76 is defined between the trailing edge 66 of the substrate and a terminal line of demarcation 78 of the photosensitive layer where it is laminated to the substrate.

Figure 4A:
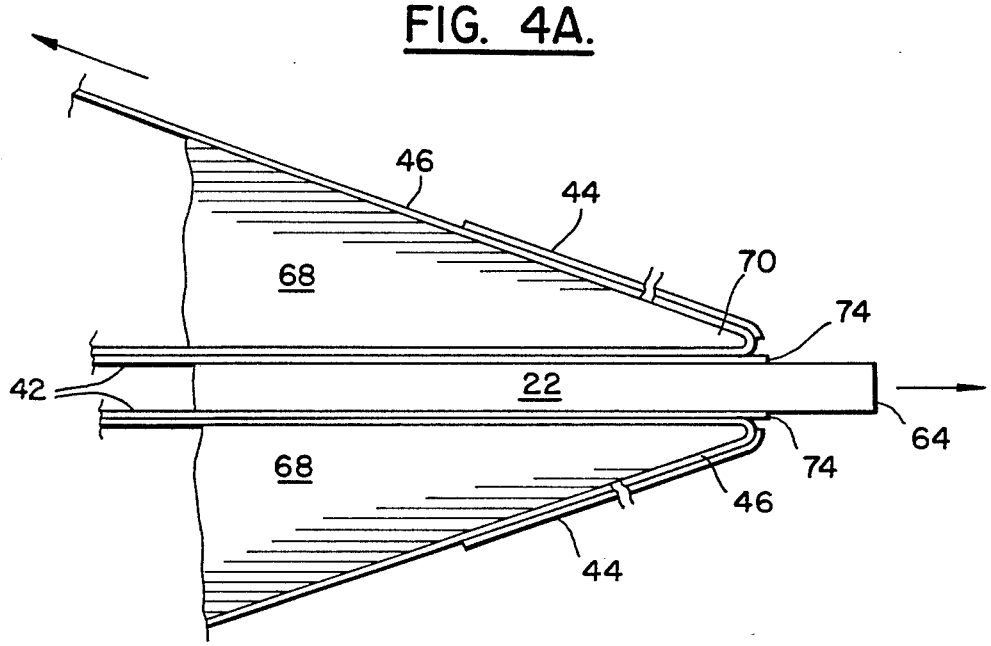
FIG. 4A is a diagrammatic detail side elevation view illustrative of the trimming step performed adjacent the leading edge of the substrate.

With continuing reference to FIG. 1, it is seen that after the leading edge 64 of a substrate 22 passes beyond the application rolls 28, it advances between a pair of opposed trimming wedges 68, each of which terminates at an apex 70 at its end farthest from the application rolls 28. As the substrate 22 continues to be advanced by the application rolls 28, it eventually reaches a position at which the line of demarcation 74 is generally coextensive with the apex 70 of an associated trimming wedge 68 (FIG. 4A). At this location, the carrier web 46 abruptly reverses direction to pass over a pair of guide rollers 80 and 82 (FIG. 1) and then onto a takeup roll 84. As the carrier web 46 abruptly reverses direction at the apex 70, the photosensitive layer 44 separates along the line of demarcation 74 partly by shearing and partly by elongation. In any event, the line of demarcation thus created is a clean one by reason of the earlier pause of the application rolls 28 in the active position which resulted in a uniform pressure and temperature being applied to the photosensitive layer 44 and to the substrate 22.

Figure 4B:
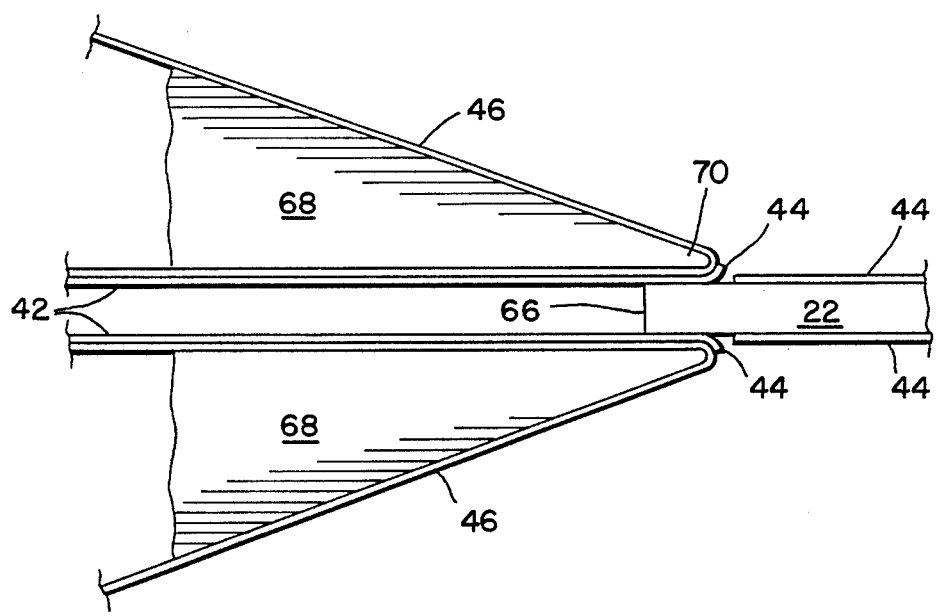
FIG. 4B is a diagrammatic detail side elevation view, similar to FIG. 4A, and illustrating the trimming operation as it is performed adjacent the trailing edge of the substrate.

In a similar fashion, when the substrate is moved to the location at which the terminal line of demarcation 78 is slightly previous to being coextensive with the apex 70 (FIG. 4B), a grip and trim unit 86 (FIG. 1) which is of generally known design is effective to draw the substrate 22 toward the right (FIG. 1) after the trailing edge 66 has advanced beyond the application rolls 28. This movement causes that portion of the photosensitive layer 44 adjacent the terminal line of demarcation 78 but not bonded to the substrate 22 to yield and break at its stressed location which is along the terminal line of demarcation 78. The grip and trim unit 86 includes upper and lower pancake members 88 and 90, respectively, which move as a unit along a track 92. A hydraulic cylinder 94 which extends and retracts a piston rod 96 is effective to move the pancake members 88, 90 along the track 92. When the substrate 22 is moved to a position such that the margin 78 is just about to exit the wedge apex 70, a gripper 98 is advanced by a suitable actuator 100 to thereby grip the substrate end and draw it rightwardly upon operation of the cylinder 94. In this manner, the substrate is drawn beyond the trimming wedges 68 and is in position for a subsequent operation.

The operative relationship of the sensors 58, 60, and 62 with the counters 32 and 34 and with the preset/counter devices 36 and 38 will now be described. The preset/counter device 36 has a pair of preset members in the form of decade thumbwheels 102 and 104. The thumbwheel 102 establishes leading edge placement. That is, it sets the encoder pulse generator 32 to count up to a predetermined number of pulses beginning when the leading edge 64 of the substrate is opposite the sensor 60. By the time the count is completed, the substrate will have advanced so that the leading edge 64 extends into, and slightly beyond the nip 40 whereupon the motors 26 and 30 temporarily terminate their operation. Immediately thereafter, the application rolls 28 are moved to their active positions.

The thumbwheel 104 establishes for the encoder pulse generator 32 a preset number of pulses after which control is turned over to the preset/counter device 38. With respect to the preset/counter device 38, a decade thumbwheel 106 establishes the number of pulses to be counted up to by the encoder pulse generator 34 beginning when the trailing edge 66 passes the sensor 60. When the preset total is reached, the application rolls 28 open to their inactive positions. Similarly, a decade thumbwheel 108 establishes the preset count to be reached after which the grip and trim unit 86 operates to draw the substrate 22 to the right after the lamination process has been completed. Preset counter device 38 starts the count for trailing edge grip trimming after the leading edge has blocked the sensor 62.

The steps of the operation performed by the lamination system 20 is generally as follows, in sequence;

| STEP NO. | EVENT OCCURRENCE-RESULTING ACTION |
| --- | --- |
| 1. | Leading edge 64 of first substrate 22 reaches sensor 58; burnt photosensitive layer is advanced by application rolls 28. |
| 2. | Leading edge of first substrate 22 passes sensor 60; starts roll close count of input conveyor pulses. |
| 3. | Both motors 26 and 30 stop; leading edge of first substrate extends slightly (e.g. 0.25 inches) into the nip 40. |
| 4. | Application rolls 28 close; begin appropriate time delay. |
| 5. | Motors 26 and 30 start; first panel continues to advance. |
| 6. | Leading edge trim operation occurs. |
| 7. | Leading edge of first substrate passes sensor 62; start trailing edge trim count of application roll pulses. |
| 8. | Trailing edge 66 of first substrate positioned opposite sensor 60; application roll open count of application roll pulses begins. |
| 9. | Leading edge of second substrate passes sensor 58; there is no effect. |
| 10. | Only motor 30 stops; trailing edge of first substrate slightly before nip 40 (e.g. approx. 0.25 inches); time delay begins. |
| 11. | Leading edge of second substrate passes sensor 60; application roll close count of input conveyor pulses begins. |
| 12. | Application rolls open after the pause of the trailing edge of the first substrate. |
| 13. | Motor 30 starts; first panel continues to advance. |
| 14. | Trailing edge trim performed on first substrate; motors 26 and 30 stop; leading edge of second substrate slightly beyond nip 40 (e.g. approx. 0.25 inches). |
| 15. | Application rolls close on second panel; start appropriate time delay. |
| 16. | Motors 26 and 30 start; first and second substrates both continue to advance. |
| 17. | Trailing edge of first substrate is grip trimmed. |
| 18. | Continue from step number 9 on a third substrate. |

Thus has been disclosed an improved process of laminating a discrete section of a photosensitive layer to a substrate and automatically trimming the laminated sections. The positioning of the laminations on the substrate is adjustable; the lines of demarcation of the laminations are sharp and well defined; and the process results in a higher rate of production than previously with reduced waste of the photosensitive layer material.

While a preferred embodiment of the invention has been disclosed in detail, it should be understood by those skilled in the art that various other modifications may be made to the illustrated embodiment without departing from the scope as described in the specification and defined in the appended claims.

What is claimed is:

1. A process for laminating discrete sections of a supported photosensitive layer to a sheet substrate comprising the steps of:
   advancing the substrate to and through a nip between converging surfaces of opposed heated application rolls;
   supplying a continuous length of the supported photosensitive layer to the nip;
   interrupting the steps of advancing the substrate when it reaches a first location positioned between the application rolls and of supplying the photosensitive layer to the nip;
   moving the converging surfaces of each of the application rolls from an inactive disengaged position transversely toward the substrate to an active position to cause pressure contact between the photosensitive layer and the substrate whereby the photosensitive layer is laminated to the substrate;

pausing for a first predetermined period of time with the application rolls in the active positions;

again advancing the substrate between the application rolls while the application rolls are in the active position;

again supplying the photosensitive layer to the nip;

interrupting the step of again advancing the substrate when it reaches a second location positioned between the application rolls and of supplying the photosensitive layer to the nip while continuing to hold the application rolls in the active position for a second predetermined period of time; and withdrawing the application rolls to the inactive position after a lapse of the second predetermined period of time.

2. A process as set forth in claim 1 wherein, at the first location, the application rolls in the active position cause pressure contact between the photosensitive layer and the substrate so as to define a margin between a leading edge of the substrate and a beginning line of demarcation of the photosensitive layer where it is laminated to the substrate.

3. A process as set forth in claim 2 wherein, at the second location, the application rolls in the active position cause pressure contact between the photosensitive layer and the substrate so as to define a margin between a trailing edge of the substrate and a terminal line of demarcation of the photosensitive layer where it is laminated to the substrate.

4. A process as set forth in claim 1 including the step of:

maintaining substantially constant the tension on the supported photosensitive layer during the step of supplying a continuous length thereof to the nip.

5. A process as set forth in claim 1 wherein the first predetermined period of time and the second predetermined period of time are approximately 0.33 seconds for "thin" substrates having a total thickness generally lying in the range of 0.007 inches and 0.013 inches and approximately 0.75 seconds for "thick" substrates having a total thickness generally lying in the range of 0.035 inches and 0.045 inches.

6. A process as set forth in claim 1 including the steps of:

sensing the leading edge of the substrate when it reaches a predetermined line of advance before reaching the nip; and beginning the step of supplying a continuous length of the supported photosensitive layer to the nip in response to the aforesaid step.

7. A process as set forth in claim 1 including the steps of:

sensing the leading edge of the substrate when it reaches a predetermined line of advance before reaching the nip;

establishing a predetermined member of pulses to be counted beginning with the preceding step;

counting the predetermined number of pulses; and beginning the step of moving the converging surfaces of each of the application rolls from the active disengaged position transversely toward the substrate to an active position upon completion of the step of counting the predetermined number of pulses.

8. A process as set forth in claim 1 wherein the steps of interrupting the step of again advancing the substrate when it reaches the second location includes the steps of:

sensing the trailing edge of the substrate when it reaches the predetermined line of advance;

establishing a predetermined number of pulses to be counted beginning with the preceding step;

counting the predetermined number of pulses; and beginning the step of withdrawing the application rolls to the inactive position upon completion of the step of counting the predetermined number of pulses.

9. A process as set forth in claim 3 including the steps of:

guiding the substrate between opposed trimming wedges located beyond the application rolls;

trimming the supported photosensitive layer from the laminated photosensitive layer along the beginning line of demarcation of the photosensitive layer when the leading edge of the substrate is generally coextensive with an outlet from the trimming wedge; and trimming the supported photosensitive layer from the laminated photosensitive layer along the terminal line of demarcation of the photosensitive layer when the trailing edge of the substrate is generally coextensive with the outlet from the trimming wedges.

10. A process as set forth in claim 5 including the step of:

heating the application rolls to a temperature of approximately 220° F. for the "thin" substrates and to a temperature of approximately 260° F. for the "thick" substrates.

11. A process for laminating discrete sections of a supported photosensitive layer to a continuing series of sheet substrates comprising the steps of:

advancing a first substrate to and through a nip between converging surfaces of opposed heated application rolls;

supplying a continuous length of the supported photosensitive layer to the nip;

interrupting the steps of advancing the first substrate when it reaches a first location positioned between the application rolls and of supplying the photosensitive layer to the nip;

moving the converging surfaces of each of the application rolls from an inactive disengaged position transversely toward the first substrate to an active position to cause pressure contact between the photosensitive layer and the first substrate whereby the photosensitive layer is laminated to the substrate;

pausing for a first predetermined period of time with the application rolls in the active positions;

again advancing the first substrate between the application rolls while the application rolls are in the active position;

again supplying the photosensitive layer to the nip;

interrupting the steps of again advancing the first substrate when it reaches a second location positioned between the application rolls and of supplying the photosensitive layer to the nip while continuing to hold the pressure rolls in the active position for a second predetermined period of time;

withdrawing the application rolls to the inactive position after a lapse of the second predetermined period of time; and continuing to advance toward the nip while the first substrate remains stationary at the second location a second substrate following immediately behind the first substrate.

12. A process as set forth in claim 11 wherein:

the speed of all substrates throughout the process remain substantially constant during such time that they are advancing.

13. A process as set forth in claim 1 including at least one of the steps of:

repositioning the first location along the path of advance of the substrate; and repositioning the second location along the path of advance of the substrate.

14. A process as set forth in claim 1 including the steps of:

advancing the substrate between opposed squeegee rollers prior to the step of advancing the substrate between converging surfaces of the opposed heated application rolls; and applying an appropriate amount of water to the surfaces of the opposed squeegee rollers to assure that the photosensitive layer will adhere to the substrate.

* * * * *